United States Patent
Musa et al.

(10) Patent No.: US 7,378,523 B2
(45) Date of Patent: May 27, 2008

(54) QUINOLINOLS AS FLUXING AND ACCELERATING AGENTS FOR UNDERFILL COMPOSITIONS

(75) Inventors: Osama M. Musa, Hillsborough, NJ (US); Zhen Liu, Monterey Park, CA (US)

(73) Assignee: National Starch and Chemical Investment Holding Corporation, New Castle, DE (US)

( * ) Notice: Subject to any disclaimer, the term of this patent is extended or adjusted under 35 U.S.C. 154(b) by 371 days.

(21) Appl. No.: 11/211,406

(22) Filed: Aug. 25, 2005

(65) Prior Publication Data

US 2007/0049722 A1    Mar. 1, 2007

(51) Int. Cl.
*C07D 215/00* (2006.01)
(52) U.S. Cl. .................................. 546/153; 528/94
(58) Field of Classification Search .............. 528/94; 546/153
See application file for complete search history.

(56) References Cited

U.S. PATENT DOCUMENTS

| | | | | |
|---|---|---|---|---|
| 5,482,809 | A * | 1/1996 | Rao et al. | 430/114 |
| 5,521,271 | A * | 5/1996 | Smith et al. | 526/265 |
| 5,744,533 | A | 4/1998 | Iwamoto et al. | |
| 6,849,940 | B1 * | 2/2005 | Chan et al. | 257/706 |
| 2002/0013420 | A1 | 1/2002 | Wang et al. | |
| 2002/0111420 | A1 * | 8/2002 | Papathomas | 524/588 |
| 2003/0111519 | A1 | 6/2003 | Kinney et al. | |
| 2004/0028875 | A1 * | 2/2004 | Van Rijn et al. | 428/98 |
| 2004/0147690 | A1 * | 7/2004 | Watkins et al. | 525/523 |
| 2005/0247916 | A1 * | 11/2005 | McCormick et al. | 252/500 |
| 2007/0185286 | A1 * | 8/2007 | Hayashi et al. | 525/476 |

FOREIGN PATENT DOCUMENTS

| EP | 1 032 038 A2 | 8/2000 |
|---|---|---|
| WO | WO 01/46290 | 6/2001 |
| WO | WO 2004/073030 | 8/2004 |

OTHER PUBLICATIONS

Ouali, Mohammed et al.: "Tautomers of styrylquinoline derivatives containing a methoxy substituent: Computation of their population in aqueous solution and their interaction with RSV integrase catalytic core"; Acta Biochimica Polonica; vol. 47 No. 1/2000; 11-22.
Du, Naiying et al.: "Synthesis and Photophysical Characterization of the Free-Radical Copolymerization of Metaloquinolate-Pendant Monomers with Methyl Methacrylate"; Journal of Pol. Science: Part A: Polymer Chemistry, vol. 43, 397-406 (2005).
Burckhalter, J.H. et al.: "Amino- and Chloromethylation of 8-Quinolinol. Mechanism of Preponderant *ortho* Substitution in Phenols under Mannich Conditions"; The Journal of Organic Chemistry, vol. 26, No. 10; 4078-4083.
Nanjundan, S. et al.: "Synthesis and characterization of poly(3-acetyl-4-hydroxyphenyl acrylate) and its Cu(II) and Ni(II) complexes";European Polymer Journal 40 (2004) 2313-2321.
Zhao, Ke-Qing et al.: "2-methyl-5-chloromethyl-8-hydroxyquinoline"; Molbank 2001, 6, M208.

* cited by examiner

*Primary Examiner*—Mark Eashoo
*Assistant Examiner*—Megan Arnberg
(74) *Attorney, Agent, or Firm*—Jane E. Gennaro

(57) ABSTRACT

Underfill compositions comprise a quinolinol or a quinolinol derivative as a fluxing agent, as an accelerating agent, or as both. The compositions are sufficiently acidic to perform well as fluxes, but not so acidic as to cause premature gelation or corrosion. The compositions also demonstrate higher Tg values than similar compositions that do not contain quinolinol or a quinolinol derivative

1 Claim, 1 Drawing Sheet

Cross section of solder joint

QUINOLINOLS AS FLUXING AND ACCELERATING AGENTS FOR UNDERFILL COMPOSITIONS

FIELD OF THE INVENTION

Figure 1:
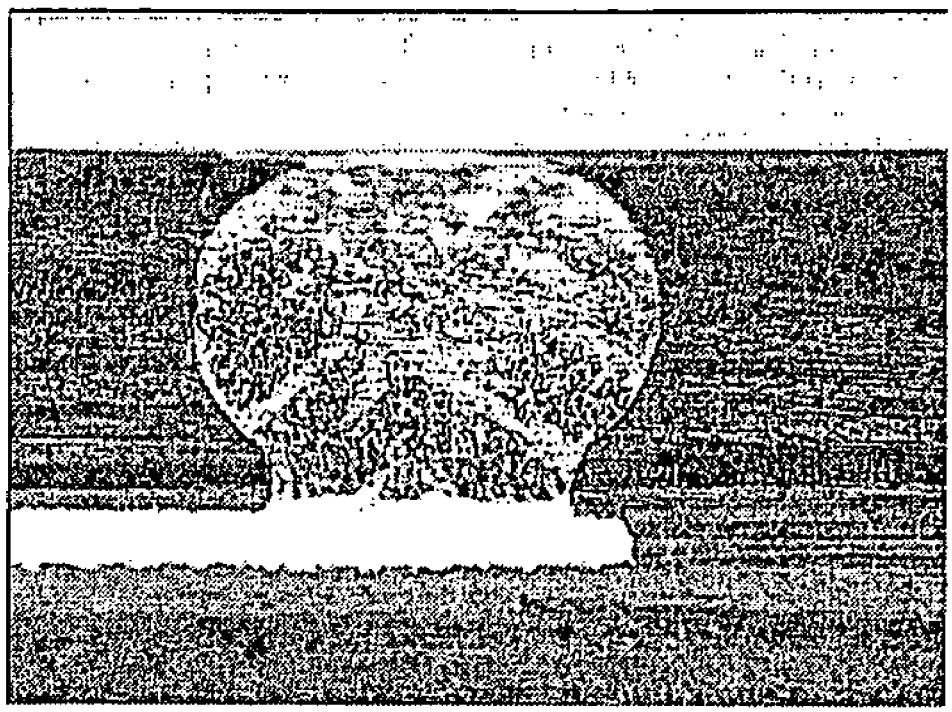

This invention relates to compositions that contain quinolinols as fluxing agent, as accelerating agents, or as both, particularly for application as underfill compositions in electronic packaging where solder joints are used for electrical interconnections.

BACKGROUND OF THE INVENTION

One method for attaching an integrated circuit onto a substrate in semiconductor packaging operations is the so-called flip-chip technology method. In flip-chip technology, the active side of the semiconductor die is bumped with metallic solder balls and flipped so that the solder balls can be aligned and placed in contact with corresponding electrical terminals on the substrate. Electrical connection is realized when the solder is reflowed to form metallurgical joints with the substrates. The coefficients of thermal expansion (CTE) of the semiconductor die, solder, and substrate are dissimilar and this mismatch stresses the solder joints, which ultimately can lead to failure of the semiconductor package.

Organic materials, often filled with organic or inorganic fillers or spacers, are used to underfill the gap between the die and the substrate to offset the CTE mismatch and to provide enforcement to the solder joints. Such underfill materials can be applied through a capillary effect, by dispensing the material along the edges of the die-substrate assembly after solder reflow and letting the material flow into the gap between the die and substrate. The underfill is then cured, typically by the application of heat.

In an alternative process known as pre-applied, an underfill material is applied onto a solder bumped semiconductor wafer, through printing if the material is a paste, or through lamination if the material is a film. The wafer is singulated into dies and an individual die subsequently bonded onto the substrate during solder reflow, typically with the assistance of temperature and pressure. This process can accomplish solder reflow and underfill cure in one operation, or the underfill can be cured in an additional process step following reflow.

In another process known as no-flow, an underfill material is applied onto the substrate, a flip-chip is placed on top of the underfill, and, typically with the assistance of temperature and pressure, the solder is reflowed to realize the interconnection between the die and substrate. Such reflow process is accomplished on thermal compression bonding equipment, in a time scale that can be as short as a few seconds. The underfill material can be cured under these same conditions, or, as with the pre-applied, in an additional process step.

In all three of these underfill operations, the solder must be fluxed either before or during the reflow operation to remove any metal oxides present, as the presence of metal oxides hinders reflow of the solder, wetting of the substrate by the solder, and electrical connection. For capillary flow operations, fluxing and removal of flux residues is conducted before the addition of the capillary flow underfill. For the no-flow and pre-applied underfill operations, the fluxing agent is added to the underfill material and fluxing occurs during reflow of the solder.

Commonly, the fluxing agents in no-flow underfill materials are typically organic acids or anhydrides, and are not suitable for chemistries that are sensitive to acidic species, such as, cyanate ester based underfill resins. In such chemistries, the acidic fluxing agents shorten underfill shelf-life due to premature gelation, and they can corrode solder interconnects in the cured underfill material.

As with any noncrystalline polymer or ceramic, cured underfill compositions have two coefficients of thermal expansion (CTE). Below the glass transition temperature (Tg), the CTE is commonly referred to as $\alpha_1$. Above the glass transition temperature, the CTE is commonly referred to as $\alpha_2$. Typically, $\alpha_2$ is much higher than $\alpha_1$. An underfill with a high Tg will remain in $\alpha_1$ throughout the range of operating temperatures experienced; an underfill with a low Tg will more likely enter $\alpha 2$ during normal use conditions, causing excessive expansion and contraction. This could lead to solder joint and device failure.

Additionally, it is known that the modulus of underfill drops quickly above the Tg; therefore, underfill compositions with higher Tg values provide better support to solder joints during any temperature cycling that occurs during fabrication or operation. For smaller semiconductor chips and for relatively soft solder, such as high lead alloys, having a high Tg is not as critical as it is for larger chips and lead free solders. However, the current practice in the flip-chip industry is to move to larger chips and lead free solder, thus creating a need for underfill with high Tg values, preferably over 100° C. and even over 130° C.

SUMMARY OF THE INVENTION

This invention is a composition comprising a quinolinol or a quinolinol derivative in which the quinolinol or quinolinol derivative is a fluxing agent and/or an accelerating agent that increases the Tg of the composition. In another embodiment, this invention is a composition comprising a quinolinol or a quinolinol derivative, which acts as a fluxing agent (for solder when solder is present) and as an accelerating agent, a curable resin, and a curing agent. The quinolinol compounds are sufficiently acidic to perform well as fluxes, but not so acidic as to cause premature gelation or corrosion. The quinolinol or quinolinol derivatives act to accelerate the cure of the composition and to increase the glass transition temperature (Tg) under low temperature cure conditions. In a further embodiment, this invention is a composition comprising a quinolinol or a quinolinol derivative, a cyanate ester resin, and a curing agent. As used herein the term "quinolinol" is synonymous with "hydroxy quinoline".

DETAILED DESCRIPTION OF THE INVENTION

The fluxing and/or accelerating agents of this invention are quinolinol compounds or compounds derived from quinolinol (hereinafter referred to as quinolinol derivatives), by which is meant, compounds that contain a quinolinol moiety. Exemplary quinolinol compounds are

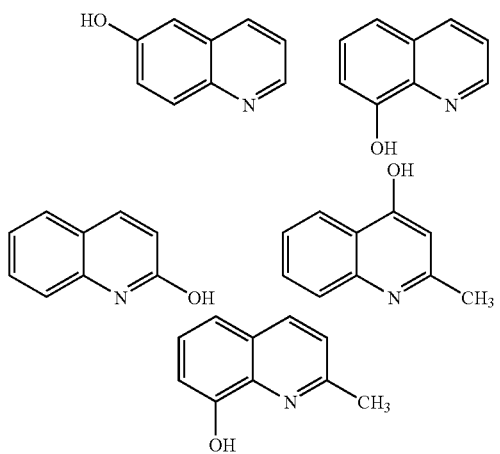

Exemplary quinolinol derivatives are those having the following bis-quinolinol structure:

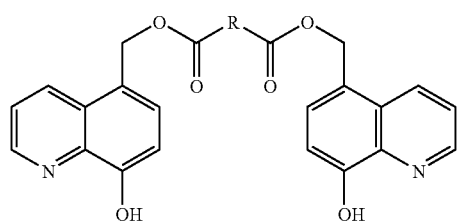

which can be prepared by the reaction of hydroxyl-functionalized quinolinol with a selected di-acid via Fisher esterification. The nature of the bridge between the quinolinol functionalities is determined by the structure of the acid. Properties such as melting point and solubility can be controlled through selection of the proper di-acid.

The reaction can be exemplified by the reaction scheme here, in which R is any organic moiety:

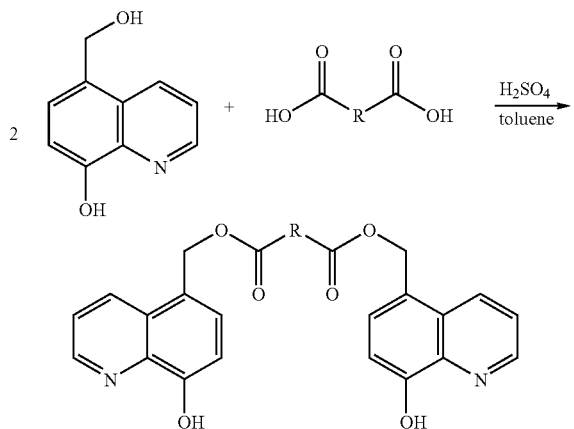

Specific suitable compounds include those in which R is an alkyl group, and in particular, a pentyl, hexyl, heptyl or octyl group. Other compounds include those in which R is an aromatic group. These compounds have reduced volatility due to their increased molecular weight, and have two labile hydrogens to act as weak acids, making them exceptionally suitable for use as fluxes in underfill compositions.

Other quinolinol derivatives are exemplified by the following compounds, which contain polymerizable functionality in addition to fluxing ability. These compounds having both quinolinol functionality and reactive functionality will be reacted into the underfill composition during cure and are not subject to volatilization and subsequent voiding at increased temperatures.

Examples include the following:

The reactive functionalities in the above Compounds A, B, and C, respectively are acrylate, styrenic, and maleimide functionalities. Other suitable reactive functionalities include epoxies, oxetanes, benzotriazoles, cinnamyl compounds, styrenic compounds, and vinyl ethers.

The syntheses of these and similar compounds are within the expertise of one skilled in the art of organic synthesis; the synthetic scheme for Compounds A, B, and C are shown here:

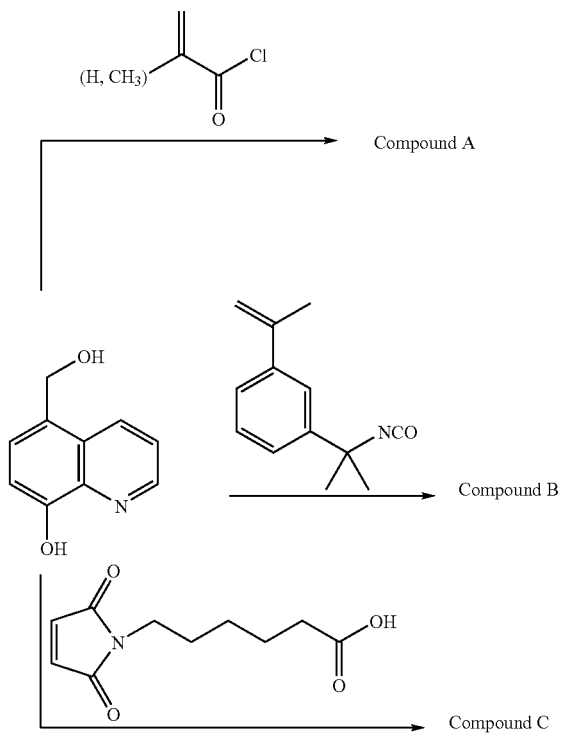

It will be understood by those skilled in the art that other functionalities can be built into these compounds by similar reactions.

In one embodiment, the inventive composition can be used to flux solders in a capillary underfill operation as described in the Background section of this specification. In that case, the composition will comprise a fluxing agent or a combination of several fluxing agents, and optionally, a solvent or a combination of several solvents.

When used in a capillary flow operation, the thermal stability of the fluxing agent should be sufficient to withstand the elevated temperature at which the solder is reflowed. The solder reflow temperature will depend on the solder composition, and will vary with the actual metallurgy. The practitioner will be able to make the determination of the solder reflow temperature by heating the solder until it reflows. The determination of the thermal stability of the fluxing agent can be readily assessed by thermal gravimetric analysis (TGA), a technique well within the expertise of one skilled in the art.

In another embodiment, the fluxing composition of this invention further comprises one or more curable resins, one or more curing agents for the resin or resins, and optionally conductive or nonconductive fillers. The curable resin or resins will be present in an amount from 10 to 99.5 percent by weight; the curing agent or agents, if present, will be present in an amount up to 30 percent by weight; fillers, if present, will be present in an amount up to 90 percent by weight; and the fluxing agent will be present in an amount from 0.5 to 30 percent by weight.

Suitable curable resins for the underfill composition include thermoset and thermoplastic polymers. Exemplary polymers include epoxy, polyamide, phenoxy, polybenzoxazine, acrylate, cyanate ester, bismaleimide, polyether sulfone, polyimide, benzoxazine, vinyl ether, siliconized olefin, polyolefin, polyester, polystyrene, polycarbonate, polypropylene, poly(vinyl chloride), polyisobutylene, polyacrylonitrile, poly(methyl methacrylate), poly(vinyl acetate), poly(2-vinylpyridine), cis-1,4-polyisoprene, 3,4-polychloroprene, vinyl copolymer, poly(ethylene oxide), poly(ethylene glycol), polyformaldehyde, polyacetaldehyde, poly(b-propiolacetone), poly(10-decanoate), poly(ethylene terephthalate), polycaprolactam, poly(11-undecanoamide), poly(m-phenylene-terephthalamide), poly(tetramethlyene-m-benzenesulfonamide), polyester polyarylate, poly(phenylene oxide), poly(phenylene sulfide), polysulfone, polyetherketone, polyetherimide, fluorinated polyimide, polyimide siloxane, poly-isoindoloquinazolinedione, polythioetherimide poly-phenylquinoxaline, polyquinixalone, imide-aryl ether phenylquinoxaline copolymer, polyquinoxaline, polybenzimidazole, polybenzoxazole, polynorbornene, poly(arylene ethers), polysilane, parylene, benzocyclobutenes, hydroxyl-(benzoxazole) copolymer, and poly(silarylene siloxanes).

Suitable curable resins can be chosen at the discretion of the practitioner, but particularly can be selected from the group consisting of cyanate esters, epoxies, bismaleimides and (meth)acryates, or a combinations of these. It is known that cyanate esters are sensitive to acidic conditions, and for that reason are usually avoided in underfill compositions, especially those with acidic fluxing agents. Thus, in one embodiment, this invention is a fluxing composition comprising a cyanate ester resin, a curing agent for the cyanate ester resin, a quinolinol or a quinolinol derivative fluxing agent as described herein, and optionally conductive or nonconductive fillers. In another embodiment, the fluxing composition further comprises an epoxy resin.

Suitable cyanate ester resins include those having the generic structure

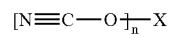

in which n is 1 or larger, and X is a hydrocarbon group. Exemplary X entities include, but are not limited to, bisphenol A, bisphenol F, bisphenol S, bisphenol E, bisphenol O, phenol or cresol novolac, dicyclopentadiene, polybutadiene, polycarbonate, polyurethane, polyether, or polyester. Commercially available cyanate ester materials include; AroCy L-10, AroCy XU366, AroCy XU371, AroCy XU378, XU71787.02L, and XU 71787.07L, available from Huntsman LLC; Primaset PT30, Primaset PT30 S75, Primaset PT60, Primaset PT60S, Primaset BADCY, Primaset DA230S, Primaset MethylCy, and Primaset LECY, available from Lonza Group Limited; 2-allyphenol cyanate ester, 4-methoxyphenol cyanate ester, 2,2-bis(4-cyanatophenol)-1,1,1,3,3,3-hexafluoropropane, bisphenol A cyanate ester, diallylbisphenol A cyanate ester, 4-phenylphenol cyanate ester, 1,1,1-tris(4-cyanatophenyl)ethane, 4-cumylphenol cyanate ester, 1,1-bis(4-cyanato-phenyl)ethane, 2,2,3,4,4,5,5,6,6,7,7-dodecafluoro-octanediol dicyanate ester, and 4,4'-bisphenol cyanate ester, available from Oakwood Products, Inc.

In further embodiments, suitable cyanate esters include: cyanate esters having the structure:

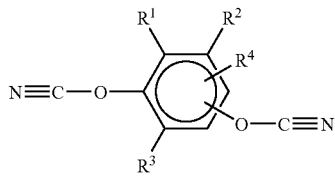

in which $R^1$ to $R^4$ independently are hydrogen, $C_1$-$C_{10}$ alkyl, $C_3$-$C_8$ cycloalkyl, $C_1$-$C_{10}$ alkoxy, halogen, phenyl, phenoxy, and partially or fully fluorinated alkyl or aryl groups (an example is phenylene-1,3-dicyanate);

cyanate esters having the structure:

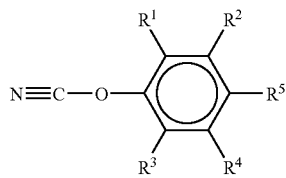

in which $R^1$ to $R^5$ independently are hydrogen, $C_1$-$C_{10}$ alkyl, $C_3$-$C_8$ cycloalkyl, $C_1$-$C_{10}$ alkoxy, halogen, phenyl, phenoxy, and partially or fully fluorinated alkyl or aryl groups;

cyanate esters having the structure:

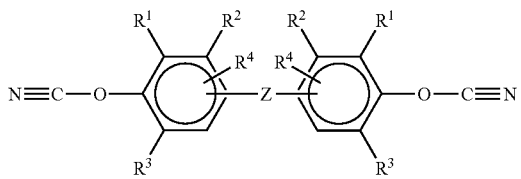

in which $R^1$ to $R^4$ independently are hydrogen, $C_1$-$C_{10}$ alkyl, $C_3$-$C_8$ cycloalkyl, $C_1$-$C_{10}$ alkoxy, halogen, phenyl, phenoxy, and partially or fully fluorinated alkyl or aryl groups; Z is a chemical bond or $SO_2$, $CF_2$, $CH_2$, $CHF$, $CHCH_3$, isopropyl, hexafluoroisopropyl, $C_1$-$C_{10}$ alkyl, O, N=N, C=C, COO, C=N, C=N—C=N, $C_1$-$C_{10}$ alkoxy, S, $Si(CH_3)_2$ or one of the following structures:

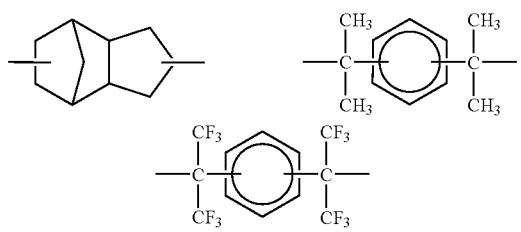

(an example is 4,4' ethylidenebisphenylene cyanate having the commercial name AroCy L-10 from Vantico);

cyanate esters having the structure:

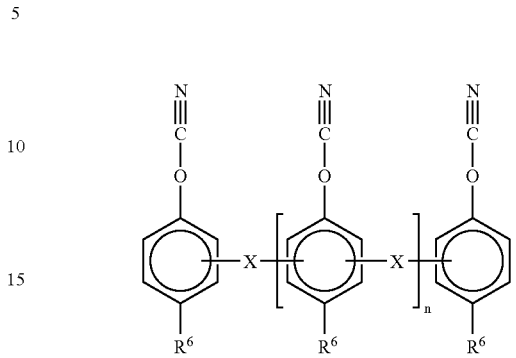

in which $R^6$ is hydrogen or $C_1$-$C_{10}$ alkyl and X is $CH_2$ or one of the following structures

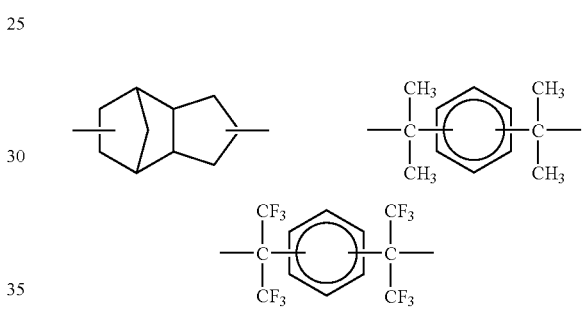

and n is a number from 0 to 20 (examples include XU366 and XU71787.07, commercial products from Vantico);

cyanate esters having the structure: N≡C—O—$R^7$—O—C≡N, or cyanate esters having the structure: N≡C—O—$R^7$ in which $R^7$ is a non-aromatic hydrocarbon chain with 3 to 12 carbon atoms, which hydrocarbon chain may be optionally partially or fully fluorinated.

Suitable epoxy resins include bisphenol, novolac, naphthalene, and aliphatic type epoxies. Commercially available materials include bisphenol type epoxy resins (Epiclon 830LVP, 830CRP, 835LV, 850CRP) available from Dainippon Ink & Chemicals, Inc.; naphthalene type epoxy (Epiclon HP4032) available from Dainippon Ink & Chemicals, Inc.; aliphatic epoxy resins (Araldite CY179, 184, 192, 175, 179) available from Ciba Specialty Chemicals, (Epoxy 1234, 249, 206) available from Dow Corporation, and (EHPE-3150) available from Daicel Chemical Industries, Ltd. Other suitable epoxy resins include cycloaliphatic epoxy resins, bisphenol-A type epoxy resins, bisphenol-F type epoxy resins, epoxy novolac resins, biphenyl type epoxy resins, naphthalene type epoxy resins, and dicyclopentadienephenol type epoxy resins.

Suitable maleimide resins include those having the generic structure

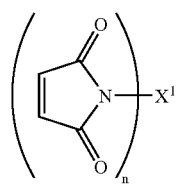

in which n is 1 to 3 and $X^1$ is an aliphatic or aromatic group. Exemplary $X^1$ entities include, poly(butadienes), poly(carbonates), poly(urethanes), poly(ethers), poly(esters), simple hydrocarbons, and simple hydrocarbons containing functionalities such as carbonyl, carboxyl, amide, carbamate, urea, ester, or ether. These types of resins are commercially available and can be obtained, for example, from Dainippon Ink and Chemical, Inc.

Additional suitable maleimide resins include, but are not limited to, solid aromatic bismaleimide (BMI) resins, particularly those having the structure

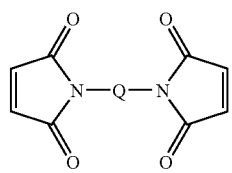

in which Q is an aromatic group. Exemplary aromatic groups include:

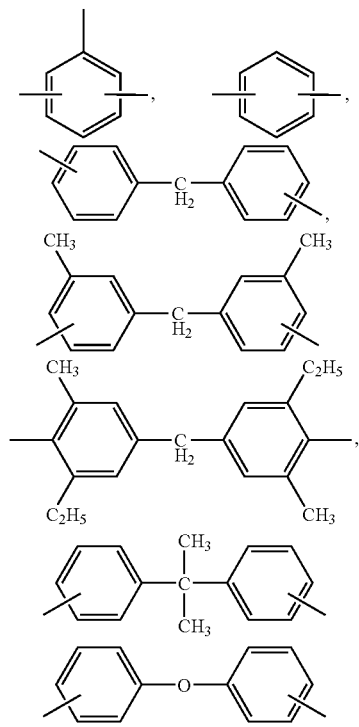

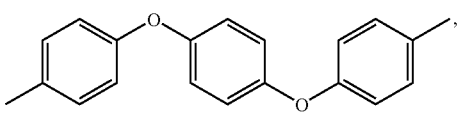

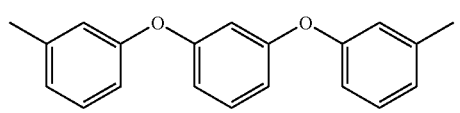

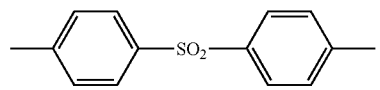

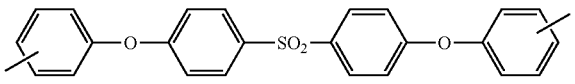

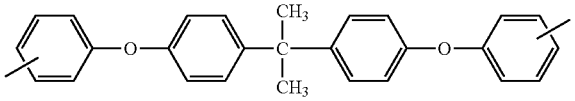

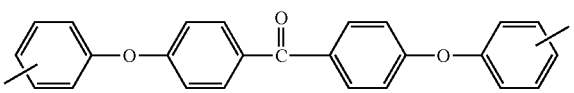

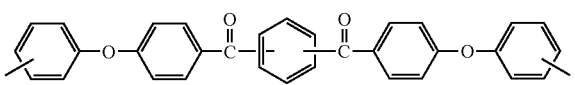

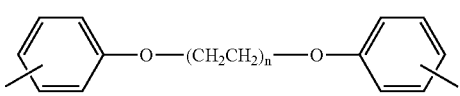

in which n is 1-3,

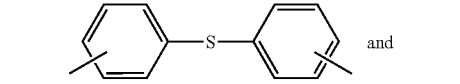

Bismaleimide resins having these Q bridging groups are commercially available, and can be obtained, for example, from Sartomer (USA) or HOS-Technic GmbH (Austria).

Other suitable maleimide resins include the following:

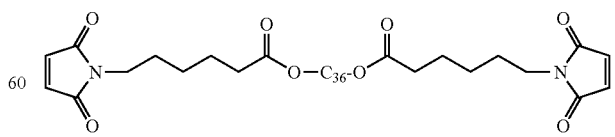

in which $C_{36}$ represents a linear or branched chain hydrocarbon chain (with or without cyclic moieties) of 36 carbon atoms;

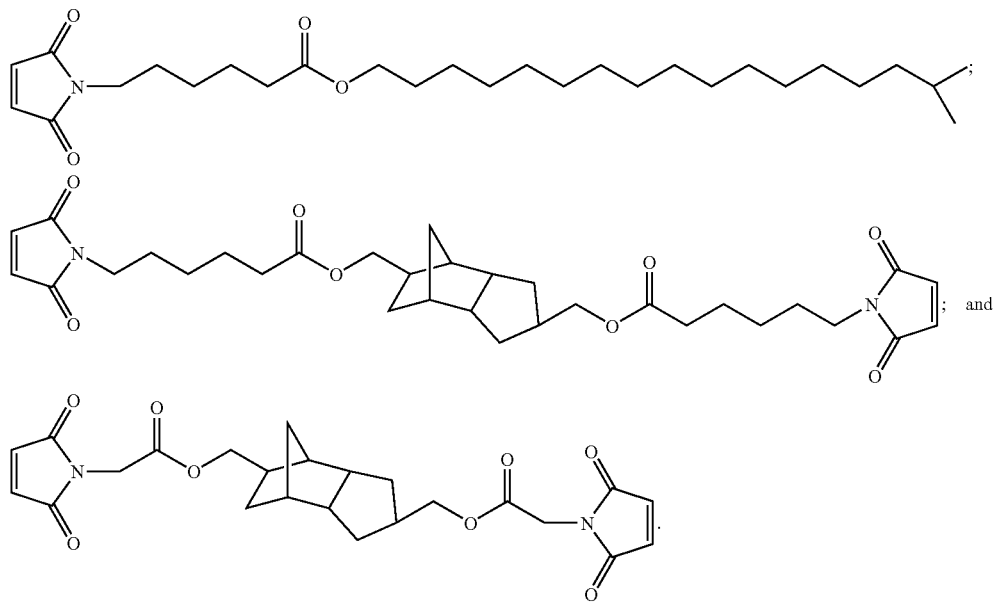

Suitable acrylate and methacrylate resins include those having the generic structure

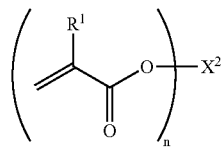

in which n is 1 to 6, $R^1$ is —H or —$CH_3$, and $X^2$ is an aromatic or aliphatic group. Exemplary $X^2$ entities include poly(butadienes), poly-(carbonates), poly(urethanes), poly(ethers), poly(esters), simple hydrocarbons, and simple hydrocarbons containing functionalities such as carbonyl, carboxyl, amide, carbamate, urea, ester, or ether.

Commercially available materials include butyl(meth)acrylate, isobutyl(meth)acrylate, 2-ethyl hexyl(meth)acrylate, isodecyl(meth)acrylate, n-lauryl(meth)acrylate, alkyl (meth)-acrylate, tridecyl(meth)acrylate, n-stearyl(meth)acrylate, cyclohexyl(meth)-acrylate, tetrahydrofurfuryl (meth)acrylate, 2-phenoxy ethyl(meth)acrylate, isobornyl (meth)acrylate, 1,4-butanediol di(meth)acrylate, 1,6-hexanediol di(meth)acrylate, 1,9-nonandiol di(meth)acrylate, perfluorooctylethyl(meth)acrylate, 1,10 decandiol di(meth)acrylate, nonylphenol polypropoxylate(meth)acrylate, and polypentoxylate tetrahydrofurfuryl acrylate, available from Kyoeisha Chemical Co., LTD; polybutadiene urethane dimethacrylate (CN302, NTX6513) and polybutadiene dimethacrylate (CN301, NTX6039, PRO6270) available from Sartomer Company, Inc; polycarbonate urethane diacrylate (ArtResin UN9200A) available from Negami Chemical Industries Co., LTD; acrylated aliphatic urethane oligomers (Ebecryl 230, 264, 265, 270, 284, 4830, 4833, 4834, 4835, 4866, 4881, 4883, 8402, 8800-20R, 8803, 8804) available from Radcure Specialities, Inc; polyester acrylate oligomers (Ebecryl 657, 770, 810, 830, 1657, 1810, 1830) available from Radcure Specialities, Inc.; and epoxy acrylate resins (CN104, 111, 112, 115, 116, 117, 118, 119, 120, 124, 136) available from Sartomer Company, Inc. In one embodiment the acrylate resins are selected from the group consisting of isobornyl acrylate, isobornyl methacrylate, lauryl acrylate, lauryl methacrylate, poly(butadiene) with acrylate functionality and poly(butadiene) with methacrylate functionality.

Suitable vinyl ether resins are any containing vinyl ether functionality and include poly(butadienes), poly(carbonates), poly(urethanes), poly(ethers), poly(esters), simple hydrocarbons, and simple hydrocarbons containing functionalities such as carbonyl, carboxyl, amide, carbamate, urea, ester, or ether. Commercially available resins include cyclohenanedimethanol divinylether, dodecylvinylether, cyclohexyl vinylether, 2-ethylhexyl vinylether, dipropyleneglycol divinylether, hexanediol divinylether, octadecylvinylether, and butanediol divinylether available from International Speciality Products (ISP); Vectomer 4010, 4020, 4030, 4040, 4051, 4210, 4220, 4230, 4060, 5015 available from Sigma-Aldrich, Inc.

The curing agent can be either a free radical initiator or ionic initiator (either cationic or anionic), depending on whether a radical or ionic curing resin is chosen, and will be present in an effective amount. For free radical curing agents, an effective amount typically is 0.1 to 10 percent by weight of the organic compounds (excluding any filler), but can be as high as 30 percent by weight. For ionic curing agents or initiators, an effective amount typically is 0.1 to 10 percent by weight of the organic compounds (excluding any filler), but can be as high as 30 percent by weight. Examples of curing agents include imidazoles, tertiary amines, organic metal salts, amine salts and modified imidazole compounds, inorganic metal salts, phenols, acid anhydrides, and other such compounds.

Exemplary imidazoles include but are not limited to: 2-methyl-imidazole, 2-undecyl-imidazole, 2-heptadecyl imidazole, 2-phenylimidazole, 2-ethyl 4-methyl-imidazole, 1-benzyl-2-methylimidazole, 1-propyl-2-methyl-imidazole, 1-cyano-ethyl-2-methylimidazole, 1-cyanoethyl-2-ethyl-4-methyl-imidazole, 1-cyanoethyl-2-undecylimidazole, 1-cyanoethyl-2-phenylimidazole, 1-guanaminoethyl-2-methylimidazole, and addition products of an imidazole and trimellitic acid.

Exemplary tertiary amines include but are not limited to: N,N-dimethyl benzylamine, N,N-dimethylaniline, N,N-dimethyl-toluidine, N,N-dimethyl-p-anisidine, p-halogeno-N,N-dimethylaniline, 2-N-ethylanilino ethanol, tri-n-butylamine, pyridine, quinoline, N-methylmorpholine, triethanolamine, triethylenediamine, N,N,N',N'-tetramethylbutanediamine, N-methylpiperidine. Other suitable nitrogen containing compounds include dicyandiamide, diallylmelamine, diaminomalconitrile, amine salts, and modified imidazole compounds.

Exemplary phenols include but are not limited to: phenol, cresol, xylenol, resorcine, phenol novolac, and phloroglucin.

Exemplary organic metal salts include but are not limited to: lead naphthenate, lead stearate, zinc naphthenate, zinc octolate, tin oleate, dibutyl tin maleate, manganese naphthenate, cobalt naphthenate, and acetyl aceton iron. Other suitable metal compounds include but are not limited to: metal acetoacetonates, metal octoates, metal acetates, metal halides, metal imidazole complexes, Co(II)(acetoacetonate), Cu(II)(acetoacetonate), Mn(II)(acetoacetonate), Ti(acetoacetonate), and Fe(II)(acetoacetonate). Exemplary inorganic metal salts include but are not limited to: stannic chloride, zinc chloride and aluminum chloride.

Exemplary peroxides include but are not limited to: benzoyl peroxide, lauroyl peroxide, octanoyl peroxide, butyl peroctoate, dicumyl peroxide, acetyl peroxide, para-chlorobenzoyl peroxide and di-t-butyl diperphthalate;

Exemplary acid anhydrides include but are not limited to: maleic anhydride, phthalic anhydride, lauric anhydride, pyromellitic anhydride, trimellitic anhydride, hexahydrophthalic anhydride; hexahydropyromellitic anhydride and hexahydrotrimellitic anhydride.

Exemplary azo compounds include but are not limited to: azoisobutylonitrile, 2,2'-azobispropane, 2,2'-azobis(2-methylbutanenitrile), m,m'-azoxystyrene. Other suitable compounds include hydrozones; adipic dihydrazide and BF3-amine complexes.

In some cases, it may be desirable to use more than one type of cure, for example, both cationic and free radical initiation, in which case both free radical cure and ionic cure resins can be used in the composition. Such a composition would permit, for example, the curing process to be started by cationic initiation using UV irradiation, and in a later processing step, to be completed by free radical initiation upon the application of heat In some systems in addition to curing agents, curing accelerators may be used to optimize the cure rate. Cure accelerators include, but are not limited to, metal napthenates, metal acetylacetonates (chelates), metal octoates, metal acetates, metal halides, metal imidazole complexes, metal amine complexes, triphenylphosphine, alkyl-substituted imidazoles, imidazolium salts, and onium borates.

When a curing step is utilized, the cure temperature will generally be within a range of 80°-250° C., and curing will be effected within a time period ranging from few seconds or up to 120 minutes, depending on the particular resin chemistry and curing agents chosen. The time and temperature curing profile for each adhesive composition will vary, and different compositions can be designed to provide the curing profile that will be suited to the particular industrial manufacturing process.

Depending on the end application, one or more fillers may be included in the composition and usually are added for improved rheological properties and stress reduction. For underfill applications the filler will be electrically nonconductive. Examples of suitable nonconductive fillers include alumina, aluminum hydroxide, silica, vermiculite, mica, wollastonite, calcium carbonate, titania, sand, glass, barium sulfate, zirconium, carbon black, organic fillers, and halogenated ethylene polymers, such as, tetrafluoroethylene, trifluoroethylene, vinylidene fluoride, vinyl fluoride, vinylidene chloride, and vinyl chloride.

The filler particles may be of any appropriate size ranging from nano size to several mm. The choice of such size for any particular end use is within the expertise of one skilled in the art. Filler may be present in an amount from 10 to 90% by weight of the total composition. More than one filler type may be used in a composition and the fillers may or may not be surface treated. Appropriate filler sizes can be determined by the practitioner, but, in general, will be within the range of 20 nanometers to 100 microns.

EXAMPLES

Example 1

Preparation of Bis-Quinolinol

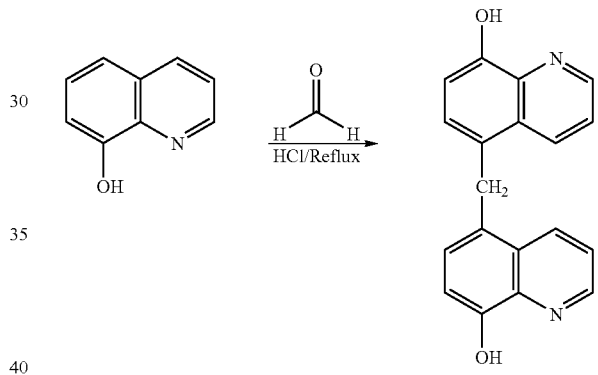

According to the procedure described by Donald. S. Noyce and Lloyd J. Dolby, *Amino- and Chloromethylation of 8-Quinolinol. Mechanism of Preponderant ortho Substitution in Phenols under Mannich Conditions*, in The Journal of Organic Chemistry, Volume 26, number 10, Oct. 24, 1961, at pages 4078 to 4083, fluxing agent bis-quinolinol was prepared via the reaction of 8-quinolinol and an excess of formaldehyde in an aqueous hydrochloric acid solution. 8-Quinolinol (29.0 grams, 0.2000 mol) and hydrochloric acid (37%, 85 mL) were combined in a four-neck, 250 mL, round bottom flask equipped with a magnetic stir bar, reflux condenser and hot oil bath. Initially, an exotherm of ~25° C. was observed upon mixing these reagents. Formaldehyde (37%, 9 mL), was then added which resulted in a change from a clear yellow solution to a gold solution. The mixture was heated at reflux for 90 minutes. During this time heavy acidic fumes were generated. After mixing for 15 minutes at reflux, crystalline yellow solids precipitated from solution. After refluxing, the mixture was cooled to room temperature and allowed to settle over night.

After 14 hours, it was observed that more solids had crystallized and that the flask was now choked with precipitate. The yellow solids were filtered from the clear gold mother liquor and dissolved in ~850 mL of water. The pH of the resulting yellow solution measured between 0 and 1.

Concentrated ammonium hydroxide was slowly added to neutralize the solution. At a pH between 3 and 4, the clear yellow solution turned opaque and at a pH of 5, fine particles started forming. More ammonium hydroxide was added to a pH of 10.02. The add was complete within 90 minutes and during this time the temperature of the reaction solution/mixture never exceeded 27° C.

The reaction was mixed for 70 minutes resulting in a creamy white mixture of fine particle size. The final pH of the reaction was 10.08. A light grey powder cake was filtered from the mixture leaving a clear gold liquor. The cake was added to 300 mL of dimethylformamide and mixed vigorously for 30 minutes. Upon filtering, a white cake was collected; the filtrate was a light purple liquor. Next, the cake was added damp to 300 mL of acetone, mixed for 30 minutes and filtered. This wash was then repeated, leaving a white cake and a clear colorless filtrate. The white cake was air dried, pulverized to a white powder and dried further under vacuum at 50° C. over night. A 36% yield was obtained from this reaction.

The structure of this material was confirmed by $^1$HNMR, with the same peaks presented as disclosed in the literature, at a purity of about 95%, DSC results for bis-quinolinol indicated that the mp is 285° C., which value matches the melting point found in the literature. TGA results indicated a weight loss of only 1.2% at 200° C.

Example 2

Preparation of Quinolinol/Piperidine

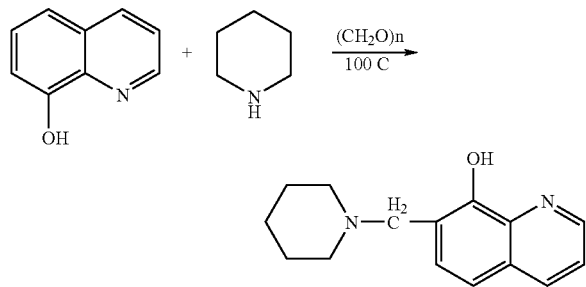

Quinolinol can be volatile, and in this example, a quinolinol/piperidine derivative was prepared in order to increase the bulk and reduce the volatility of quinolinol. The asymmetry of this derivative promoted a lower melting point than that found for the bis-quinolinol. Quinolinol/piperidine was prepared in a melt by the reaction of equimolar amounts of 8-quinolinol, piperidine and paraformaldehyde.

8-Quinolinol (29.0 grams, 0.2000 mol), piperidine (17.0 grams, 0.2000 mol) and paraformaldehyde (6.0 grams, 0.2000 mol) were charged to a 100 mL 3-neck round bottom flask equipped with a mechanical mixer, thermometer and reflux condenser. With mixing, the solids partially dissolved to an opaque gold liquid and the reaction temperature rose from room temperature to 71° C. within five minutes. Mixing was continued until the reaction temperature dropped to ~60° C. At this point, the flask was placed in a hot oil bath preheated to 100° C. The reaction was mixed in the bath over ~3.5 hours, during which time the reaction temperature ranged between 80 and 90° C.

At the end of the reaction, the product was a dark amber syrup. Residual starting materials were removed from the syrup via a Kugelrohr apparatus at 85° C. The resulting clear gold viscous liquid (33 grams) was combined with 33 mL of petroleum ether and triturated. A pale ivory powder thus formed from the syrup. The powder was washed twice more in petroleum ether and dried in the vacuum oven over two days at 70° C. The structure of this material was confirmed by both $^1$HNMR and GC/MS, with the results conforming to those found in the literature. A 41% yield was obtained from this reaction. The DSC melting point of 116° C. matched the melting point found in the literature (Donald. S. Noyce and Lloyd J. Dolby, *Amino- and Chloromethylation of 8-Quinolinol. Mechanism of Preponderant ortho Substitution in Phenols under Mannich Conditions*, in The Journal of Organic Chemistry, Volume 26, number 10, Oct. 24, 1961, at pages 4078 to 4083).

Example 3

Preparation of Hydroxy-Functionalized Quinolinol

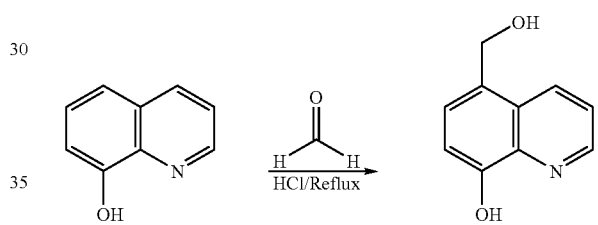

An hydroxy functionalized quinolinol intermediate was prepared via the reaction of equimolar amounts of 8-quinolinol and formaldehyde in an aqueous hydrochloric acid solution. (Note that quinolinol was synthesized similarly but with a molar excess of formaldehyde relative to 8-quinolinol). The product of this reaction showed improved solubility over bis-quinolinol and was more easily characterized. The synthesis procedure was obtained from Donald. S. Noyce and Lloyd J. Dolby, *Amino- and Chloromethylation of 8-Quinolinol. Mechanism of Preponderant ortho Substitution in Phenols under Mannich Conditions*, in The Journal of Organic Chemistry, Volume 26, number 10, Oct. 24, 1961, at pages 4078 to 4083.

8-Quinolinol (120.0 grams, 0.8267 mol), hydrochloric acid (37%, 352 mL) and formaldehyde (37%, 67.7 grams), were combined in a four-neck one liter round bottom flask equipped with a magnetic stir bar, thermometer, reflux condenser and hot oil bath. Upon mixing these reagents, an exotherm of ~20° C. was observed. The reaction became a clear gold solution. Next, the reaction was heated in a 125° C. oil bath and almost immediately yellow solids precipitated from solution. Heating was continued at reflux (95 to 111° C.) for ~65 minutes. The bright yellow reaction mixture then was cooled to room temperature.

The solids were filtered from the clear yellow mother liquor and dissolved in ~800 mL of water. The pH of the resulting deep yellow solution measured between 0 and 1.

Concentrated ammonium hydroxide was slowly added to neutralize the solution. At a pH between 3 and 4, the clear yellow solution turned opaque red-orange. At pH 5, fine particles started forming and the reaction thickened. More ammonium hydroxide was added to a pH of 10.0. The add was complete within 50 minutes and during this time the temperature of the reaction solution/mixture never exceeded 35° C. The reaction was mixed for 60 minutes resulting in a yellow slurry of fine particle size. It was then mixed over night and the final pH of the reaction was 10.15.

A tan powder cake was filtered from the mixture leaving a dark amber liquor. The cake was added to 500 mL of dimethylformamide and mixed vigorously for 30 minutes. Upon filtering, a white cake was collected; the filtrate was a light clear gold liquor. This water wash was repeated. The white cake was air dried, pulverized to a powder and dried further under vacuum at 45° C. over night. A 42% yield was obtained from this reaction. The structure of this material was confirmed by both $^1$HNMR and GC/MS. In addition, a DSC scan was performed to yield a mp of 137° C., which was very close to the melting point of 138-139° C. found in the above referenced literature.

Example 4

Work Life of Underfill Composition

The bis-quinolinol (3.5 parts by weight) from Example 1 was formulated with cyanate ester (20 parts by weight, a mixture of product number XU71787.07 from Huntsman and product name Lecy from Lanza at a ratio of 1 to 1); epoxy (25.95 parts by weight, product name Epon 826 from Resolution Performance Products); nonyl phenol (0.47 parts by weight); catalyst (0.03 part by weight); rheology modifier (0.05 part by weight, product Modaflow from Solutia, Inc.); and silica filler (50 parts by weight), into an underfill composition and tested for electrical interconnection and worklife measured as change in viscosity over time. Each formulation passed the electrical interconnection test showing that fluxing had occurred. The results of worklife are set out in TABLE A and show that the viscosity remains stable after a freeze/thaw cycle for up to 16 hours.

TABLE A

WORKLIFE OF UNDERFILL COMPOSITION

| Time after Freeze/Thaw, hours | Viscosity @ 5 rpm, mPas |
|---|---|
| 0 | 58,822 |
| 14 | 56,400 |
| 16 | 58,165 |

Example 5

Interconnect. FIG. 1

A fluxing composition was prepared to contain a quinolinol fluxing agent having the structure

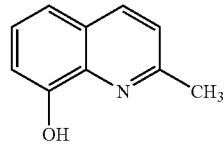

at 3.5% by weight, an epoxy resin at 28.4% by weight, a cyanate ester resin at 18.01% by weight, a catalyst at 0.08% by weight, a rheology modifier at 0.01% by weight, and a silica filler at 50% by weight. Assemblies of a solder bumped die and BT substrate were prepared using a thermal compression Toray Bonder to establish electrical interconnections between the bumped die and the substrates. The fluxing composition was dispensed onto the BT substrate covered by solder mask with the exposed traces being Ni/Au plated onto Cu. A silicon die (5×5 mm) bumped with $Sn_{95.5}Cu_{3.8}Ag_{0.7}$ solder bumps was aligned with the exposed traces on the substrate. The substrate was heated to 80° C. and the die and substrate contacted with pressure of 20 Newtons in the thermal compression bonder. The assembly was then heated in ramped profile from 200° C. to 220° C. within 1-2 seconds and held at 220° C. for 5-6 seconds to finish the cure and solder joint formation.

The electric connections of the solder joints were confirmed by measuring the resistance across the circuits using an Agilent 34401 Digit Multimeter. These interconnections were checked immediately after thermal compression bonding and again after further curing for two hours at 160° C. The electric interconnection showed little change before and after curing and the assembly passed the electrical test indicating electrical connection. SEM picture is shown in FIG. 1 and indicates good solder wetting and solder joint quality. A control composition of the same formulation but without the quinolinol did not achieve electrical interconnection.

Example 6

Tg Improvement

Compositions were prepared as shown in TABLE B using different quinolinols and the glass transition temperature (Tg) measured against a control without any quinolinol. The results are also reported in TABLE B and show that the addition of the quinolinol causes an increase in Tg. (The Tg was measured after holding the formulation at 160° C. for two hours.

TABLE B

Tg OF FORMULATIONS WITH QUINOLINOL

| | Parts by Weight | | | |
|---|---|---|---|---|
| Formula Components | A control | B | C | D |
| cyanate ester | 21.6 | 20 | 20 | 20 |
| epoxy | 28 | 26 | 26 | 26 |
| 2-methyl-8-quinolinol | | 3.5 | | |
| bisquinolinol (Ex. 1) | | | 3.5 | |
| 4-hydroxy-2-methylquinoline | | | | 3.5 |
| nonyl phenol | 0.47 | 0.47 | 0.47 | 0.47 |

TABLE B-continued

Tg OF FORMULATIONS WITH QUINOLINOL

| | Parts by Weight | | | |
|---|---|---|---|---|
| Formula Components | A control | B | C | D |
| Co(III) AcAc | 0.03 | 0.03 | 0.03 | 0.03 |
| silica filler | 50 | 50 | 50 | 50 |
| surfactant | 0.05 | 0.05 | 0.05 | 0.05 |
| Tg (160° C. 2 hours) | 82 | 125 | 158 | 149 |

The 2-methyl-8-quinolinol has the structure

The 4-hydroxy-2-methylquinoline has the structure:

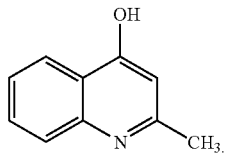

The results show that the presence of the quinolinol acted as an accelerating agent for the composition causing an increase in Tg.

What is claimed is:

1. A compound suitable for use as an agent for fluxing, accelerating, and increasing the glass transition temperature of a composition selected from the group consisting of

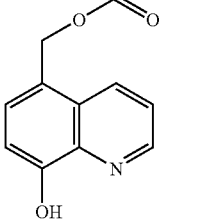 and

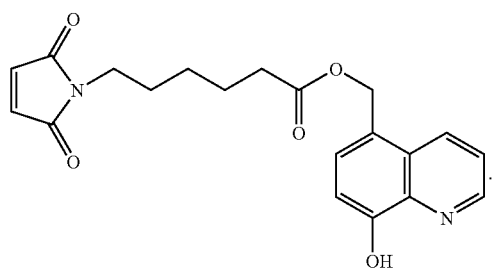

* * * * *